(12) United States Patent
Hartmann

(10) Patent No.: US 6,750,671 B2
(45) Date of Patent: Jun. 15, 2004

(54) APPARATUS FOR TESTING SEMICONDUCTOR DEVICES

(75) Inventor: Udo Hartmann, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/915,984

(22) Filed: Jul. 25, 2001

(65) Prior Publication Data
US 2002/0021141 A1 Feb. 21, 2002

(30) Foreign Application Priority Data
Jul. 25, 2000 (DE) .......................... 100 36 177

(51) Int. Cl.$^7$ ............................ G01R 31/26; G01C 7/00
(52) U.S. Cl. ...................... 324/765; 324/73.1; 365/201
(58) Field of Search .................. 324/765, 767, 324/158.1, 73.1, 719, 96; 365/201; 438/16–18, 69; 702/80, 119; 714/718–719, 42, 736; 257/55, 105, 86–87, 63

(56) References Cited

U.S. PATENT DOCUMENTS

| 3,493,767 A | * | 2/1970 | Cohen ..................... 250/214.1 |
| 4,683,420 A | * | 7/1987 | Goutzoulis ................... 324/96 |
| 4,799,021 A | * | 1/1989 | Cozzi ........................ 324/73.1 |
| 4,929,081 A | * | 5/1990 | Yamamoto et al. ......... 356/457 |
| 5,365,334 A | * | 11/1994 | Bottka |

FOREIGN PATENT DOCUMENTS

| DE | 39 03 296 A1 | 8/1989 |
| DE | 38 06 209 C2 | 5/1992 |
| EP | 0 254 691 B1 | 9/1993 |

OTHER PUBLICATIONS

"Non–Destructive, Non–Contacting Test of Si Wafers by Thermore–Flectance" IBM Tech. Disc. Bull. Feb. 1987 (NN87024105).*
Kittel, C.: "Introduction to Solid State Physics", John Wiley & Sons, Inc., Ed. 2, Nov. 1965, pp. 1–4 and 346–382.

* cited by examiner

*Primary Examiner*—Kamand Cuneo
*Assistant Examiner*—Paresh Patel
(74) *Attorney, Agent, or Firm*—Laurence A. Greenberg; Werner H. Stemer; Ralph E. Locher

(57) ABSTRACT

An apparatus for testing wafer-level semiconductor devices, in particular memory chips in which a tunable light source radiates energy onto the semiconductor devices. The tunable light source is constructed to adjust the radiated light to a specific wavelength and to a specific intensity and to project the light for a predetermined time. When the semiconductor devices are irradiated with the light, electrons in defective ones of the semiconductor devices, in which a distance between a valence band and a conduction band has a lower value as compared with that of defect-free ones of the semiconductor devices, can be transferred into the conduction band from the valence band. These defective or "poor" semiconductor devices can thus be separated out.

7 Claims, 1 Drawing Sheet

APPARATUS FOR TESTING SEMICONDUCTOR DEVICES

BACKGROUND OF THE INVENTION

Field of the Invention

The present invention relates to an apparatus for testing semiconductor devices in order to find defective semiconductor devices in which the distance between the valence band and the conduction band in a defective semiconductor device is lower when compared with that of a defect-free semiconductor device.

Semiconductor devices such as, in particular, volatile and non-volatile memory chips, are presently tested at the wafer level in order to find defective semiconductor devices, such as, for example, memory cell transistors having so-called soft defects. These soft defects may be features of the semiconductor devices such as excessively high leakage currents, excessively low threshold voltages, etc.

As an example of semiconductor devices, wafer-level memory chips have previously been tested, in which the memory chips are subjected to disturbance cycles at an elevated temperature. First the memory chips are written to and then the temperature of the memory chips is increased. Finally, the memory chips are read at the elevated temperature.

During this procedure, the temperature increase causes an increase in the leakage currents and, consequently, a decrease in the retention time of the memory chips in order to be able to separate out from the latter those memory chips which have proved to be defective because of this "aging treatment".

The above procedure has a disadvantage in that relatively long waiting times have to be observed for changing the temperature of the semiconductor chips. These long waiting times cause long test times, which result in a costly overall test program. Moreover, it must be remembered that different semiconductor devices require different temperature ranges for testing, which in turn necessitates different equipment for the corresponding test apparatuses.

SUMMARY OF THE INVENTION

It is accordingly an object of the invention to provide an apparatus for testing semiconductor devices which overcomes the above-mentioned disadvantageous of the prior art apparatus and methods of this general type. In particular, it is an object of the invention to provide an apparatus for testing semiconductor devices in which it is not necessary to wait for temperature changes so that long waiting times can be avoided, and in which, moreover, there is no need to make complicated changes to the equipment when testing different semiconductor devices.

With the foregoing and other objects in view there is provided, in accordance with the invention an apparatus for testing semiconductor devices to find defective semiconductor devices in which a distance between a valence band and a conduction band has a lower value as compared with that of defect-free semiconductor devices. The apparatus includes a tunable light source for projecting light onto semiconductor devices. The tunable light source is constructed to adjust the light to a specific wavelength and to a specific intensity and to project the light for a predetermined time so that when the semiconductor devices are irradiated with the light, electrons in defective ones of the semiconductor devices can be transferred into the conduction band from the valence band. In the defective ones of the semiconductor devices, the distance between the valence band and the conduction band has a lower value as compared with that of defect-free ones of the semiconductor devices.

In other words, the object of the invention is achieved by providing a tunable light source, which can project light onto the semiconductor devices. This light in each case is of a specific wavelength and a specific intensity for a respectively predetermined time so that when the semiconductor devices are irradiated with the light, electrons can be transferred into the respective conduction band from the valence bands that are located an excessively small distance away from the conduction band.

Thus, instead of temperature changes for finding memory cells having an increased leakage current potential, the apparatus according to the invention uses, during their test, the action of radiation energy emitted by a tunable light source. The wavelength of the light radiated by the light source enables direct setting of the energy that an electron in the semiconductor device receives in order to pass from the valence band into the conduction band. This energy is too small in the case of defective semiconductor devices. Since this jumping of the electrons from the valence band into the conduction band takes place practically instantaneously, long waiting times which inevitably occur in the case of temperature changes are obviated. Furthermore, because of the use of the tunable light source, there is no need to change or exchange the equipment, since the energy radiated by the light source or the wavelength of the light emitted by the light source can readily be adapted to the distance between valence band and conduction band, which distance is too small in the case of "poor" semiconductor devices.

If the energy E required for transferring an electron from the valence band into the conduction band, which is too small in the case of "poor" semiconductor devices, is 2.5 eV, for example, then a value of 497 nm is produced for the wavelength $\lambda$ with the aid of the known equations $E=h*f$ and $c=\lambda*f$ (h=Planck's constant; f=frequency of the radiated light; c=speed of light).

What is essential to the apparatus according to the invention, then, is the generation of a disturbance quantity by irradiating the semiconductor devices with a light source whose color temperature can be regulated in a continuously variable manner. In other words, a light source is used in which the wavelength of the radiated light can be preset. As a result, it is possible to directly set the energy which acts on the semiconductor devices, with the result that electrons can readily be moved from the valence band of the semiconductor devices into, if appropriate, a conduction band that is an excessively small distance away.

In accordance with an added feature of the invention, the tunable light source is built into a wafer sampler which subjects the semiconductor devices to a test cycle. In this wafer sampler, the semiconductor devices, that is to say in particular a wafer, can be adjusted below the light source. Equally, however, it is also possible to adjust the light source above the wafer. All that is important here is that the light source can be adjusted exactly with regard to the semiconductor devices, that is to say with regard to the wafer in the present example.

In accordance with an additional feature of the invention, instead of a light source, it is also possible, if appropriate, to use optical waveguides which can guide light from a remote tunable light source onto the semiconductor devices in a targeted manner.

The light source itself may, for example, be drivable via a customary interface, with the result that it can perform the radiation of light onto the semiconductor devices in a targeted manner.

During a test, by way of example, memory cells in a wafer are written to in a conventional manner. The wafer sampler is then driven in order to position the wafer below the light source of the wafer sampler. Information regarding a desired wavelength is subsequently output to the light source from a test program. In this case, this desired wavelength corresponds to an excessively small distance between valence band and conduction band of the memory cells. The light source is then switched on and off, depending on the test program. The wafer sampler is subsequently driven in order that it moves into a test position in which the memory cells irradiated by the light source can be tested. During this testing, the defective memory cells are then determined, in which memory cells, because of an excessively small distance between the valence band and the conduction band, electrons were transferred into the conduction band as a result of the irradiation by the light source.

During the above test operation, it must be ensured—depending on the semiconductor devices respectively tested—that a possibly required voltage supply or driving by signals, such as, for example, refresher signals in DRAMs (Dynamic Random Access Memories, is not interrupted.

Other features which are considered as characteristic for the invention are set forth in the appended claims.

Although the invention is illustrated and described herein as embodied in an apparatus for testing semiconductor devices, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
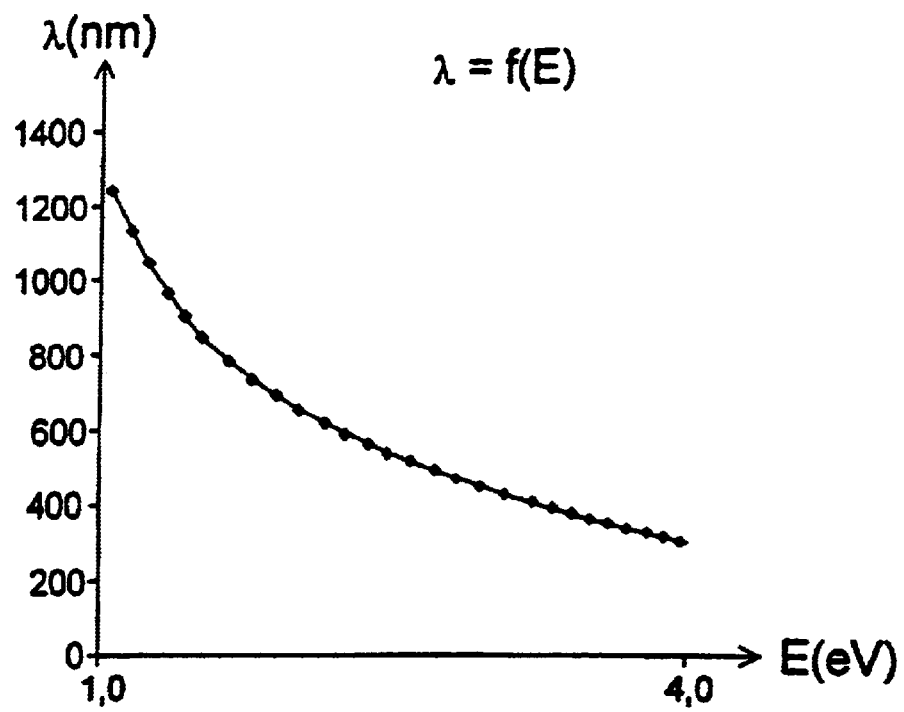
FIG. 1 is a schematic diagram showing the dependence of the wavelength $\lambda$ (in nm) of light as a function of the energy of the light in eV.

Referring now to the figures of the drawing in detail and first, particularly, to FIG. 1 thereof, there is schematically shown the dependence of the wavelength $\lambda$ of light on the energy E of the light, that is to say the function $\lambda=f(E)$. As can be seen from the figure, by way of example, an energy of 2.5 eV corresponds to a wavelength $\lambda$ of 497 nm.

The wavelength of the light that is to be radiated by a light source can be selected by taking account of the relationship between the energy E and the wavelength $\lambda$ of light as is shown schematically in FIG. 1. By way of example, if the "normal" distance between the valence band and the conduction band of a semiconductor device is given by about 2.7 eV, then an energy of 2.5 eV signifies an excessively small distance between these bands. Defective semiconductor devices can thus be separated out by being irradiated with light having an energy of 2.5 eV, since irradiation by light having this energy brings about a transition of electrons between the valence band and the excessively small conduction band.

Figure 2:
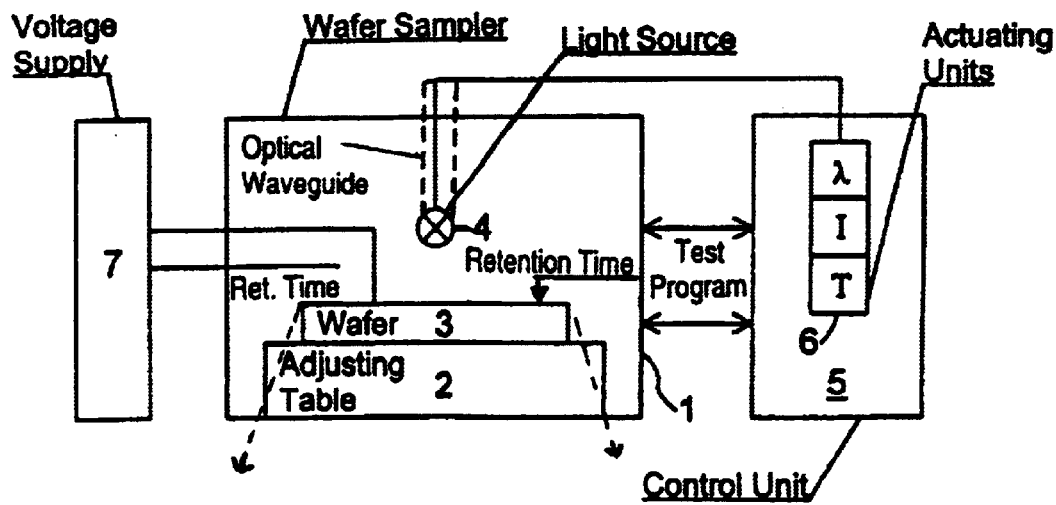
FIG. 2 shows a schematic illustration of the apparatus for testing semiconductor devices.
Figure 2:
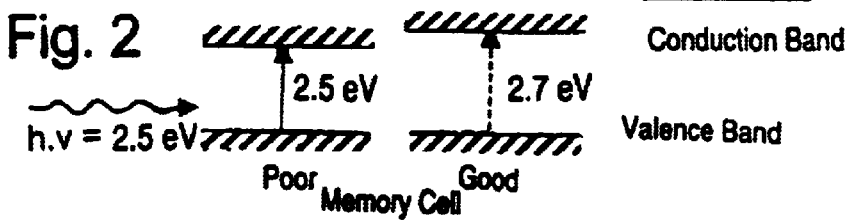

FIG. 2 schematically shows an apparatus for testing semiconductor devices. A silicon wafer 3 having a multiplicity of memory chips is situated on an adjusting table 2 in a wafer sampler 1. The silicon wafer 3 is irradiated by a light source 4 arranged in the wafer sampler 1. With the aid of the adjusting table 2, it is possible to set the relative position between the silicon wafer 3 and the light source 4.

The light source 4 is tunable, so that it can emit light of a desired wavelength $\lambda$ and of a desired intensity I for a predetermined time T. For this purpose, actuating units 6 are provided in a control unit 5 connected to the wafer sampler 1. These actuating units 6 can be used to set the wavelength $\lambda$ and the intensity I of the light radiated by the light source 4 and also the time duration T of this radiation process.

A voltage supply 7 serves to maintain supply voltages that may be necessary for the silicon wafer 3 or its memory chips during a test run in the wafer sampler 1.

While the wavelength $\lambda$ defines the energy E of the light radiated onto the silicon wafer 3 by the light source 4, the intensity I defines the intensity of the luminous flux and thus the number of electrons to be transported, if appropriate, into a different band. The time duration T during which the silicon wafer 3 is irradiated by the light source 4 can be chosen to be very short in the ms range, since the band transition of the electrons takes place practically instantaneously. In other words, long waiting times need not occur in the apparatus for testing semiconductor devices.

Instead of the silicon wafer 3, it is also possible, of course, to test another semiconductor device. The latter may be composed of any suitable semiconductor material, such as, for example, SiC, $A_{III}B_V$, Ge, etc.

Other tests of the wafer 3 can additionally be performed in the wafer sampler 1. In other words, the light source 4 can readily be additionally built into an existing wafer sampler and can be connected to a corresponding control unit 5.

In a test run, if the silicon wafer 3 includes memory chips, first, the memory cells of the silicon wafer 3 are written to in a customary manner. After the adjustment of the light source above the silicon wafer 3 and the setting of the actuating units 6 to the desired wavelength $\lambda$ and intensity I, the memory chips of the silicon wafer 3 are irradiated with light from the light source 4. For this purpose, the light source 4 is switched on and off in accordance with a test program. As a result of this irradiation, a transition of electrons from the valence band to the conduction band takes place in "poor" memory cells. These "poor" memory cells in which the electrons have passed from the valence band into the conduction band can then be separated out since they cannot retain the stored information in the same way as the "good" memory cells.

In this way, in a short time, it is possible to perform a reliable test of the memory cells at the wafer level without long waiting times.

I claim:

1. A method for testing wafer-level memory chips having memory cells, the method which comprises:

writing to the memory cells so that the memory cells have stored information;

with a tunable light source, projecting light having a specific wavelength and a specific intensity onto the wafer-level memory chips for a predetermined time so that irradiated electrons in defective ones of the wafer-level memory chips, in which a distance between a valence band and a conduction band has a lower value as compared with that of defect-free ones of the wafer-level memory chips, are transferred into the conduction band from the valence band; and separating out ones of the memory cells that cannot retain the stored information.

2. The method according to claim 1, which comprises constructing the tunable light source to regulate a frequency of the light in a continuously variable manner.

3. The method according to claim 1, which comprises constructing a wafer sampler providing a housing for the light source.

4. The method according to claim 1, which comprises:

providing a surface for positioning the wafer-level memory chips thereon; and moveably disposing a component selected from the group consisting of the tunable light source and the surface to adjust a relative position between the tunable light source and the surface.

5. The method according to claim 1, which comprises providing the tunable light source with optical fibers having ends, the ends of the optical fibers for projecting the light onto the wafer-level memory chips.

6. The method according to claim 1, which comprises providing the wafer-level memory chips as memory chips having memory cells that have been written to.

7. The method according to claim 1, which comprises providing a voltage supply for supplying a voltage to the wafer-level memory chips during testing of the wafer-level memory chips.

* * * * *